United States Patent
Hayashi et al.

(10) Patent No.: US 7,139,548 B2
(45) Date of Patent: Nov. 21, 2006

(54) SEMICONDUCTOR INTEGRATED CIRCUIT DEVICE AND WIRELESS COMMUNICATION SYSTEM

(75) Inventors: Norio Hayashi, Tamamura (JP); Jiro Shinbo, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 330 days.

(21) Appl. No.: 10/690,606

(22) Filed: Oct. 23, 2003

(65) Prior Publication Data

US 2004/0102176 A1  May 27, 2004

(30) Foreign Application Priority Data

Nov. 21, 2002  (JP)  ............... 2002-338250

(51) Int. Cl.
*H04B 1/28* (2006.01)
*H04B 1/26* (2006.01)

(52) U.S. Cl. ............... 455/333; 455/318; 331/108 R

(58) Field of Classification Search .......... 455/74, 455/84, 110, 118, 313, 314, 315, 316, 318, 455/323, 333; 331/1 R, 2, 30, 108 R
See application file for complete search history.

(56) References Cited

U.S. PATENT DOCUMENTS

| | | | |
|---|---|---|---|
| 4,068,173 A | * | 1/1978 | Weise ............... 455/118 |
| 4,479,259 A | * | 10/1984 | Fenk ............... 455/318 |
| 6,442,380 B1 | * | 8/2002 | Mohindra ............... 455/234.1 |
| 6,847,812 B1 | * | 1/2005 | Doetsch et al. ............... 455/316 |

* cited by examiner

*Primary Examiner*—Quochien B. Vuong
(74) *Attorney, Agent, or Firm*—Mattingly, Stanger, Malur & Brundidge, P.C.

(57) ABSTRACT

A semiconductor integrated circuit device has an oscillation circuit using either an oscillator or an oscillation module, as an external part of a reference oscillation circuit. Two external terminals are provided in correspondence with the oscillation circuit. A control terminal (base terminal) of a transistor of the oscillation circuit is connected to one external terminal, and part of an output of the transistor is fed back to the control terminal. The other external terminal is connected to a power source voltage terminal via a resistive element of a high resistance value. Capacitor elements are connected between the two external terminals. When an oscillator is connected to the one of the external terminals, the other external terminal is fixed to a constant potential. When an electronic part for oscillation (oscillation module) is connected, the other external terminal is set into an open state.

11 Claims, 7 Drawing Sheets

SEMICONDUCTOR INTEGRATED CIRCUIT DEVICE AND WIRELESS COMMUNICATION SYSTEM

BACKGROUND OF THE INVENTION

The present invention relates to a technique effectively applied to an oscillation circuit using an external part such as an oscillator like a quartz oscillator or an electronic part for oscillation like an oscillation module. More specifically, the invention relates to a technique effectively applied to an oscillation circuit for generating a reference frequency signal of a semiconductor integrated circuit device for high frequency which demodulates a reception signal and modulates a transmission signal in a wireless communication system such as a portable telephone.

In a semiconductor integrated circuit for high frequency (hereinbelow, called an RF IC) for modulating a transmission signal and demodulating a reception signal, a PLL (Phase Locked Loop) circuit having a VCO (Voltage Controlled Oscillator) for generating an oscillation signal of a predetermined frequency to be synthesized with a reception signal or a transmission signal is used. As it is known, the PLL circuit is a circuit for comparing an oscillation output of the VCO with a signal of a predetermined frequency as a reference by a frequency comparator (also called a phase comparator) and feedback controlling the VCO so that the phase frequencies of the two signals coincide with each other.

Since relatively high precision is required for the oscillation frequency of the VCO used for a portable telephone, it is difficult to use, as a reference oscillation circuit, a circuit which can be provided on a chip, such as an LC oscillator or a ring oscillator. Generally, an oscillation circuit using an external part such as an oscillator like a quartz oscillator or an electronic part for oscillation like an oscillation module is employed.

SUMMARY OF THE INVENTION

In an RF IC, either an oscillator or an oscillator module to be used as an external part of a reference oscillation circuit is fixed. In many cases, the user cannot select which one to use, so that the RF IC has a problem such that flexibility in construction of a system is low for the following reason.

FIG. 7 shows an example of a Colpitts' oscillation circuit using a quartz oscillator. Shown in the diagram are a quartz oscillator XTAL, capacitor elements C1, C2, and C3, a bipolar transistor Q1, a resistive element R1, and a bias circuit Bias for making bias current pass to the bipolar transistor Q1. The components except for the quartz oscillator XTAL can be formed on a semiconductor chip. Although the capacitor element C3 can be also formed on the semiconductor chip, one more external terminal is required, so that an external part is generally used.

In the oscillation circuit of FIG. 7, a circuit form as shown in FIG. 8 in which an oscillation module MDL is connected to an external terminal P1 via a capacitor element C0 and an oscillation signal is input can be also considered. However, the capacitor elements C1 and C2 are elements as an extra load for the oscillation module. When the output power of the oscillation module is small, an oscillation signal cannot be supplied to an internal circuit by driving the bipolar transistor Q1.

In the Colpitts' oscillation circuit as shown in FIG. 7 using the quartz oscillator, tens pF is necessary for the capacitor elements C1 and C2. However, the load capacity of an oscillation module provided in the market at present is specified as 10 to 15 pF. Consequently, it is difficult to construct the oscillation circuit as shown in FIG. 8 by using a commercial oscillation module.

A circuit as shown in FIG. 9 constructed so that the capacitor elements C1 and C2 in the oscillation circuit of FIG. 7 are provided as external elements can be also considered. When the capacitor elements C1 and C2 are used as external elements, however, the number of external terminals increases and the number of external parts increases. A problem occurs such that it becomes difficult to miniaturize the system.

On the other hand, an oscillation circuit as shown in FIG. 10 in which, in addition to the external terminal P1 for connecting the quartz oscillator XTAL, another terminal P2 for connecting the oscillation module MDL is provided can be also considered. In the circuit, however, a change-over switch or a signal synthesizing circuit for selecting one of two oscillations signals and transmitting the selected oscillation signal to an internal circuit is necessary in a post stage of the oscillation circuit. In the case where the change-over switch is used, an external terminal P3 for inputting a signal for controlling the switch is further required. On the other hand, in the case of providing the signal synthesizing circuit at a post stage of the oscillation circuit, the circuit scale becomes large, it increases the chip area or it is feared that a signal attenuates.

An object of the invention is to provide a semiconductor integrated circuit device having therein an oscillation circuit using either an oscillator or an oscillation module, which can be selected by the user, as an external part of a reference oscillation circuit while suppressing a large increase in the number of external parts and the number of external terminals.

Another object of the invention is to provide a semiconductor integrated circuit device having therein an oscillation circuit using either an oscillator or an oscillation module, which can be selected by the user, as an external part of a reference oscillation circuit while suppressing a large increase in the circuit scale and the chip area.

The above and other objects and novel features of the invention will become apparent from the description of the specification and the appended drawings.

An outline of a representative one of inventions disclosed in the specification will be described as follows.

Two external terminals are provided in correspondence with an oscillation circuit. A control terminal of a transistor as a component of the oscillation circuit is connected to as one of the external terminals, and a path for feeding back a part of an output of the transistor to the control terminal is provided so that the oscillation circuit can oscillate. The other external terminal is connected to a power source voltage terminal via a resistive element of a high resistance value. Capacitor elements are connected between the two external terminals. When an oscillator is connected to the one of the external terminals, the other external terminal is fixed to a constant potential. When an electronic part for oscillation is connected, the other external terminal is set into an open state.

According to the means, when an oscillation module is connected to one of the external terminals, by setting the other external terminal into an open state, the capacitor elements between the two external terminals are made unseen from the outside, and an oscillation signal from the oscillation module can be supplied with a low loss to an internal circuit.

When an oscillator is connected to one of the external terminals, by applying a ground potential to the other external terminal from the outside of the chip, current is made to flow to the transistor connected to the one of the external terminals, an emitter voltage or a source voltage of the transistor is fed back to the base terminal or the gate terminal via the capacitor elements, and an oscillating operation is performed. The oscillation circuit operates as a Colpitts' oscillation circuit for generating an oscillation signal of a frequency according to the natural frequency of the oscillator by a resonance action with the external oscillator and can supply the oscillation signal to an internal circuit.

DETAILED DESCRIPTION OF THE PREFERRED EMBODIMENTS

Embodiments of the invention will now be described with reference to the drawings.

Figure 1:
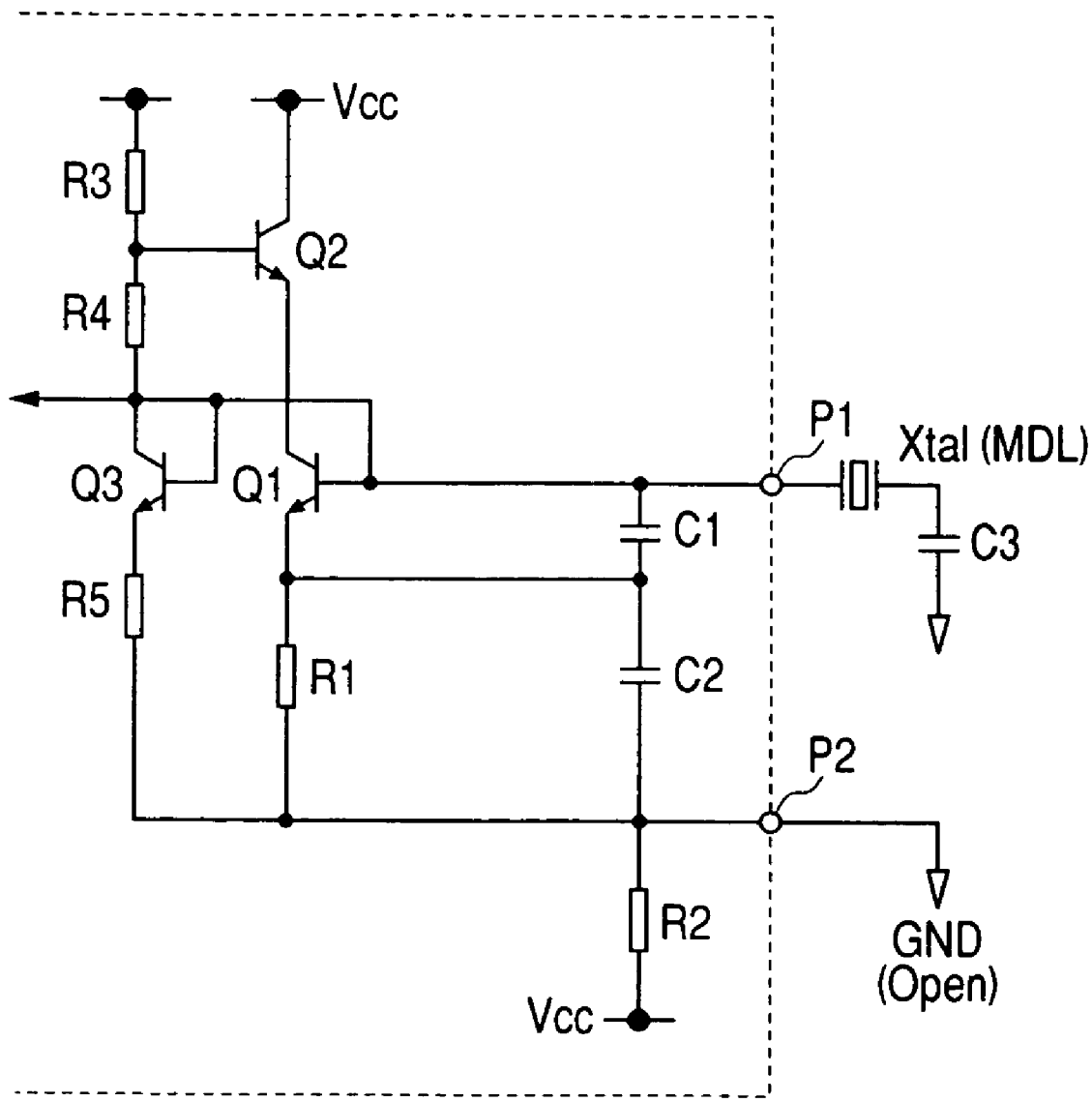
FIG. 1 is a circuit diagram showing a first embodiment of an oscillation circuit according to the invention to which either a quartz oscillator or an oscillation module can be connected.

FIG. 1 shows a first embodiment of an oscillation circuit according to the invention to which either a quartz oscillation or an oscillation module can be connected.

An oscillation circuit of the embodiment has a bipolar transistor Q1 whose base terminal is connected to an external terminal P1, a resistor R1 connected between an emitter terminal of the transistor Q1 and an external terminal P2, a transistor Q2 connected between a collector terminal of the transistor Q1 and a power source voltage terminal Vcc and making bias current flow to the transistor Q1, a bias circuit constructed by resistors R3 and R4, a transistor Q3, and a resistor R5 connected in series between the power source voltage terminal Vcc and the external terminal P2, for applying a bias potential to the base terminal of the transistor Q2, capacitors C1 and C2 connected in series between the external terminals P1 and P2, a resistor R2 connected between the external terminal P2 and the power source terminal Vcc, and the like.

The connection node between the capacitor elements C1 and C2 and the emitter terminal of the transistor Q1 are connected to each other. The connection node of the resistors R3 and R4 and the base terminal of the transistor Q2 are connected to each other. The transistor Q3 is diode connected in such a manner that its base terminal and its collector terminal are connected to each other. The base terminal of the transistor Q3 is connected to the external terminal P1 like the base terminal of the transistor Q1. The resistor R2 has a resistance value of about 100 kΩ.

In the circuit of the embodiment, a quartz oscillator XTAL is connected to the external terminal P1. When a ground potential is applied to the external terminal P2, bias current is made to flow to the transistor Q1, emitter voltage of the transistor Q1 is fed back to the base terminal via the capacitor element C1 and an oscillation operation is performed. The circuit of the embodiment operates as a Colpitts' oscillation circuit for generating an oscillation signal of a frequency according to the natural frequency of the oscillator by a resonance action with the external quartz oscillator XTAL, and supplying the oscillation signal to an internal circuit.

Moreover, since no excessive resistor which deteriorates the oscillation gain is connected between the terminals P1 and P2 except for the capacitor elements C1 and C2, an oscillation signal of a large amplitude can be obtained. Since the external terminal P2 is grounded on the outside of the chip, the oscillation current of the circuit flows from the external terminal P2 to the outside of the chip. Consequently, there is also an advantage such that noise in the internal circuits of the chip can be reduced.

On the other hand, when an oscillation module is connected to the external terminal P1 and the external terminal P2 is set in an open state (floating state in which the external terminal P2 is not connected to any potential), since the resistor R2 has high resistance, the potential of the terminal on the other side of the external terminal P1 of the capacitor elements C1 and C2 becomes indeterminate. When an oscillation signal is supplied from the oscillation module on the outside to the external terminal P1, the potential at the other end of the capacitor elements C1 and C2 fluctuates according to fluctuation of the oscillation signal. Consequently, the capacitor elements C1 and C2 are not seen as loads from the oscillation module.

Since the emitters of the transistors Q1 and Q2 are connected to the power source voltage terminal Vcc via the resistors R1, R5, and R2, collector current is not made to flow to the transistors Q1 and Q3. Therefore, the circuit of the embodiment does not perform the oscillation operation so that the oscillation signal from the external oscillation module input to the external terminal P1 can be transmitted as it is to the internal circuit without being attenuated or distorted.

Figure 7:
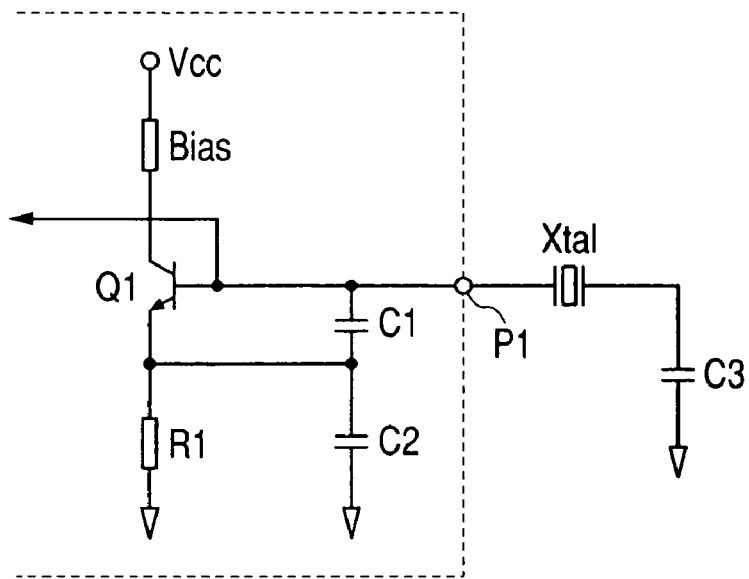
FIG. 7 is a circuit diagram showing an example of a Colpitts' oscillation circuit using a quartz oscillator.
Figure 8:
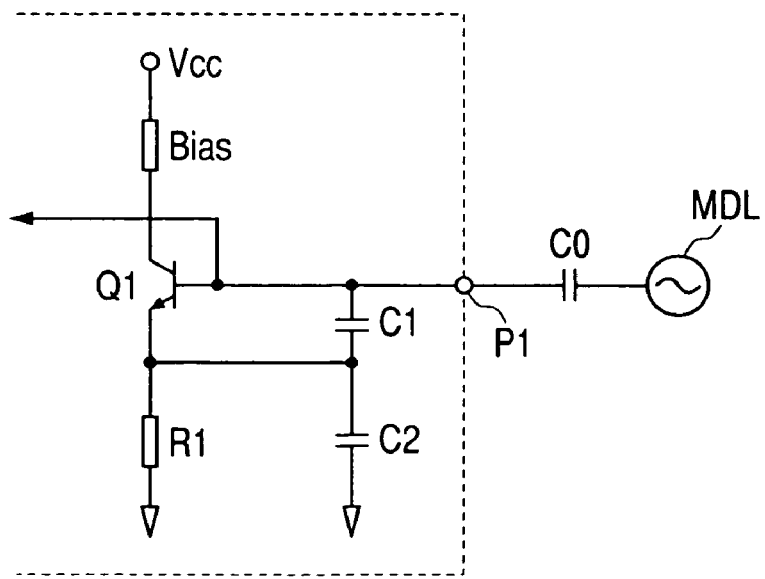
FIG. 8 is a diagram illustrating a case where the oscillation module is connected to the external terminal of the oscillation circuit of FIG. 7.
Figure 9:
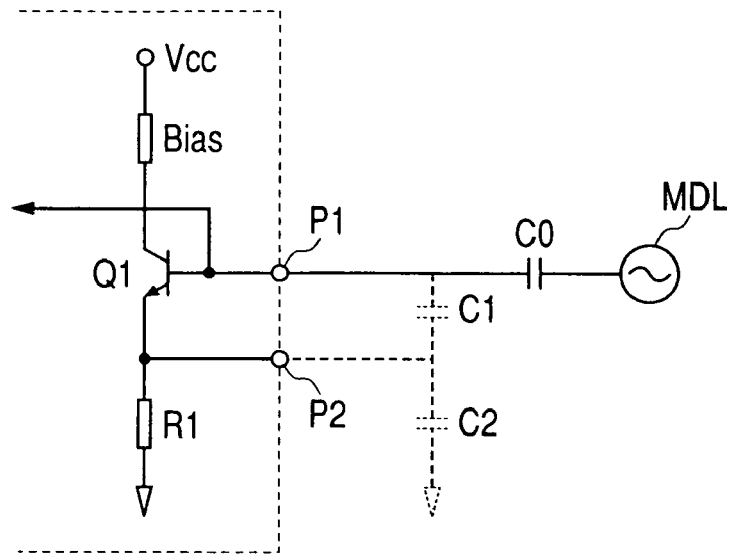
FIG. 9 is a circuit diagram showing an example of an oscillation circuit in which either an oscillator or an oscillation module can be connected to an external terminal, which was examined prior to the present invention.
Figure 10:
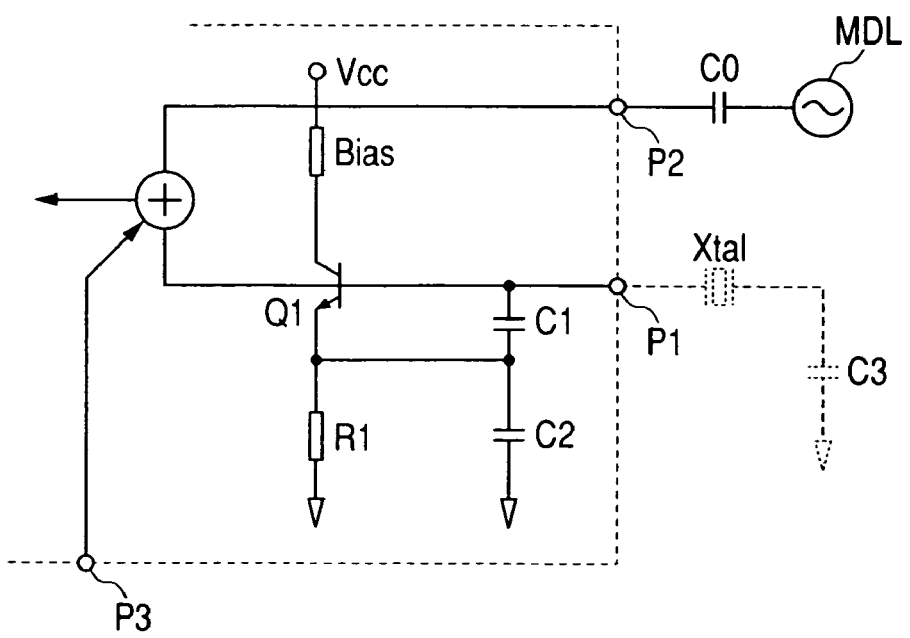
FIG. 10 is a circuit diagram showing an example of another oscillation circuit in which either an oscillator or an oscillation module can be connected to the external terminal, which was examined prior to the present invention.

According to the embodiment as described above, although the number of external terminals is larger than that in the circuit of FIG. 7 by one, when the quartz oscillator or the oscillation module is connected to the external terminal P1, the oscillation signal can be supplied to the internal circuit. Since it is sufficient to connect the external terminal P2 to the ground point or to set the external terminal P2 into an open state in accordance with a part connected to the external terminal P1, it is unnecessary to increase the number of external elements.

In the RF IC to which the oscillation circuit of the invention can be suitably applied, generally, a plurality of ground terminals to be connected to the ground point are often provided. Such a semiconductor integrated circuit device has an advantage that, by using one of the plurality of ground terminals originally provided as the external terminal P2, the number of substantial external terminal numbers is not increased.

In the circuit of FIG. 1, instead of providing the external terminal P2, the resistor R2 may be replaced with a switch element. The switch element is turned on when a quartz oscillator is connected to the external terminal P1, thereby fixing the other terminal of the capacitor element C2 to the ground potential in the chip. The switch element is turned off when an oscillation module is connected to the external terminal P1 so that the potential at the other terminal of the capacitor element C2 is floated.

By supplying a control signal of turning on/off the switch element from a proper control register or the like in the chip, even in a semiconductor integrated circuit device having only one ground terminal, without increasing the number of external terminals, an oscillation signal can be supplied to the internal circuit irrespective of either a quartz oscillator or an oscillation module is connected.

In this case, however, if a switch element of which on-state resistance is 10Ω or less is not used, when the circuit operates as an oscillation circuit, a sufficient oscillation amplitude cannot be obtained. Consequently, in the case of constructing the switch element by a MOSFET, the device size (gate width) becomes relatively large. On the other hand, in the case where the switch element is set in an off state and an oscillation signal is input from an oscillation module connected to the external terminal P1, off-state resistance of the switch element has to be set to infinite, so that a bipolar transistor cannot be used as the switch element. Therefore, as in the embodiment of FIG. 1, it is the most realistic way to provide the external terminal P2 and connect the resistor R2 between the external terminal P2 and the power source voltage terminal Vcc.

Figure 2:
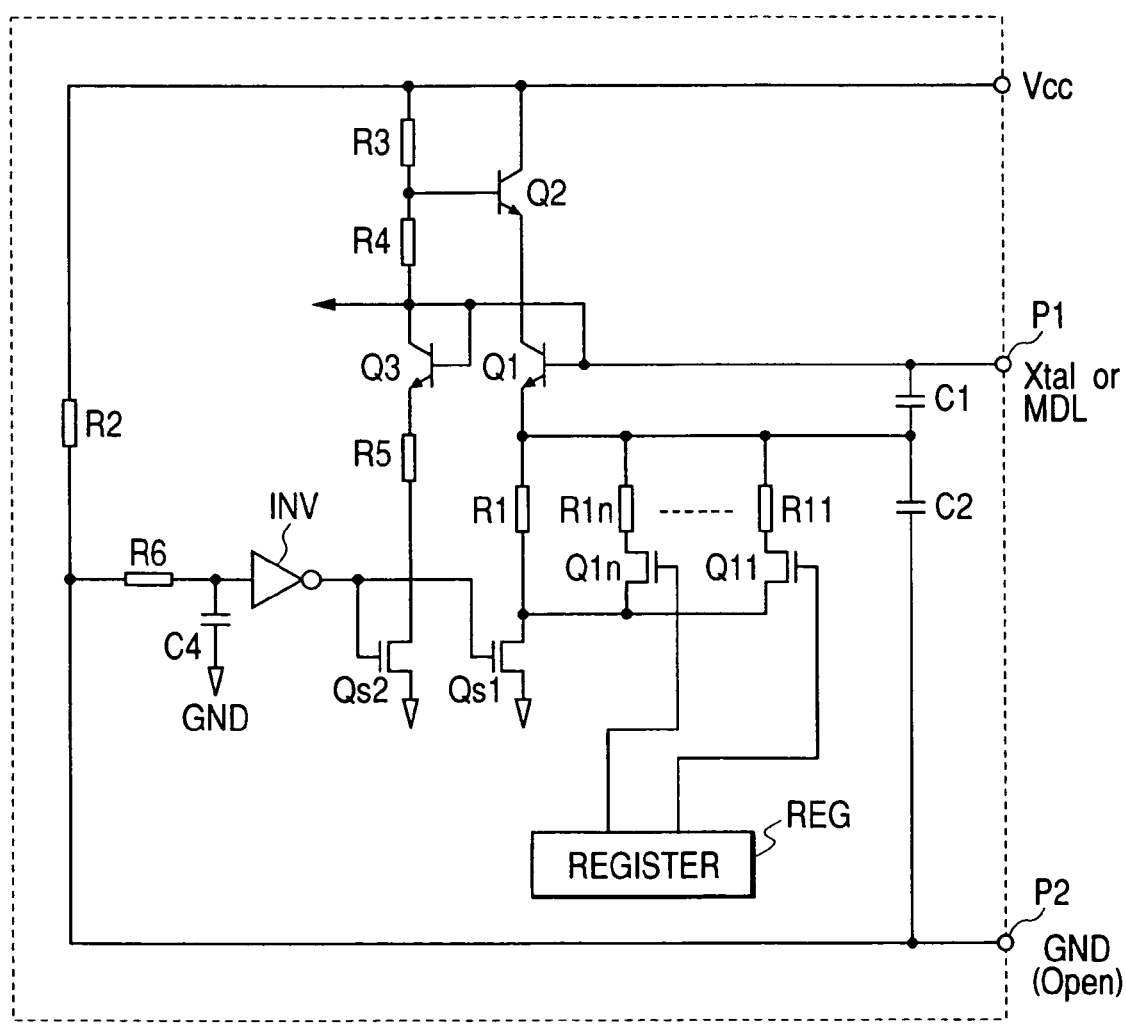
FIG. 2 is a circuit diagram showing a second embodiment of an oscillation circuit according to the invention to which either a quartz oscillator or an oscillation module can be connected.

FIG. 2 shows a second embodiment of the oscillation circuit according to the invention to which either a quartz oscillator or an oscillation module can be connected. In FIG. 2, the same elements and terminals as those of FIG. 1 are designated by the same reference numerals and their description will not be repeated.

The circuit of the embodiment has, in addition to the elements constructing the circuit of FIG. 1, switch MOSFETs Qs1 and Qs2 connected to the resistors R1 and R5 in series, respectively, between the emitters of the bipolar transistors Q1 and Q2 whose base terminals are connected to the external terminal P1 and the ground point, and an inverter INV whose output terminal is connected to the gate terminals of the MOSFETs Qs1 and Qs2. The input terminal of the inverter INV is connected to the external terminal P2 via a resistor R6, and the switch MOSFETs Qs1 and Qs2 are on/off controlled by the inverter INV.

More concretely, when the ground potential is applied to the external terminal P2, an output of the inverter INV is set to the high level, the switch MOSFETs Qs1 and Qs2 are turned on, bias current is made to flow to the transistor Q1, and the circuit operates as a Colpitts' oscillation circuit.

On the other hand, when the external terminal P2 is set to an open state, an output of the inverter INV is set to the low level, the switch MOSFETs Qs1 and Qs2 are turned off, and the bias current of the transistor Q1 is interrupted. Consequently, the circuit does not perform oscillating operation and transmits a signal which is input to the external terminal P1 as it is to the internal circuit.

The resistor R6 connected to the input terminal of the inverter INV is a device which makes the inverter INV unseen from the external terminal P1 when the external terminal P2 is set to an open state, an oscillation signal from an external oscillation module is input to the external terminal P1, and the impedance at the other terminal of the capacitor element C2 becomes high, so that the resistor R6 has a relatively high resistance value. With the configuration, the oscillation signal input from the external oscillation module to the external terminal P1 can be transmitted to the internal circuit without deteriorating its characteristics.

Further, in the second embodiment, sets of resistors and switch MOSFETs "R11, Q11" to "R1$n$, Q1$n$" connected in series are provided in parallel with the emitter resistor R1 of the transistor Q1. The on/off state of the MOSFETs Q11 to Q1$n$ is set according to the value of the register REG.

The larger the number of MOSFETs Q11 to Q1$n$ which are turned on is, the larger the number of current paths through which the collector current of the transistor Q1 flows becomes, and the same effect as that in the case of decreasing the resistance value of the resistor R1 is obtained. Since the properties of commercial quartz oscillators are various, by making the resistance value of the resistor R1 changeable as in the embodiment and setting the resistance value according to an oscillator used, an oscillation signal of high precision can be generated. The resistors R11 to R1$n$ may have the same value or different values which are, for example, the n-th powers of 2.

In the embodiment of FIG. 2, the sets of resistors and switch MOSFETs "R11, Q11" to "R1$n$, Q1$n$" are provided in parallel with the resistor R1, and the on/off state of the MOSFETs Q11 to Q1$n$ is directly set by the value of the register REG. Alternately, as shown in FIG. 3, it is also possible to provide sets of resistors and switch MOSFETs "R11, Q11" to "R1$n$, Q1$n$" which are connected in series in parallel with the resistor R1 and the MOSFET Qs1, provide AND gates G1 to G1$n$ for obtaining AND of a signal of each bit of the register REG and an output signal of the inverter INV, and set the on/off state the MOSFETs Q11 to Q1$n$ in accordance with the output of the AND gates.

Figure 3:
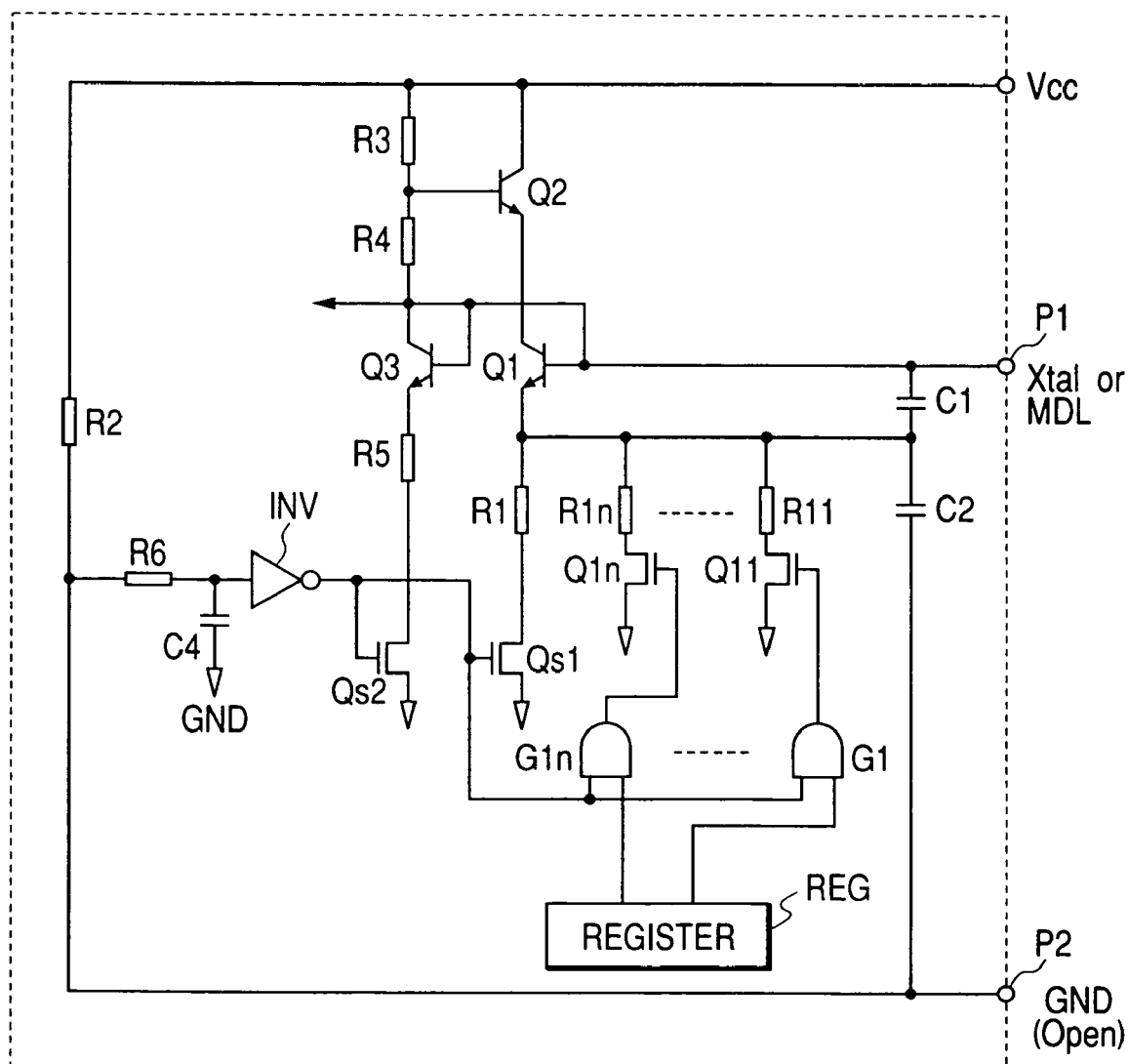
FIG. 3 is a circuit diagram showing a modification of the oscillation circuit of the second embodiment.

The AND gates G1 to G1$n$ of FIG. 3 may be replaced with an NAND gate and an inverter. A configuration obtained by combining the embodiment of FIG. 2 and the embodiment of FIG. 3 may be also employed, in which the circuit device has sets of resistors and switch MOSFETs connected in series which are provided in parallel with the resistor R1 and sets of resistors and switch MOSFETs connected in series which are provided in parallel with the resistor R1 and the MOSFET Qs1.

Figure 4:
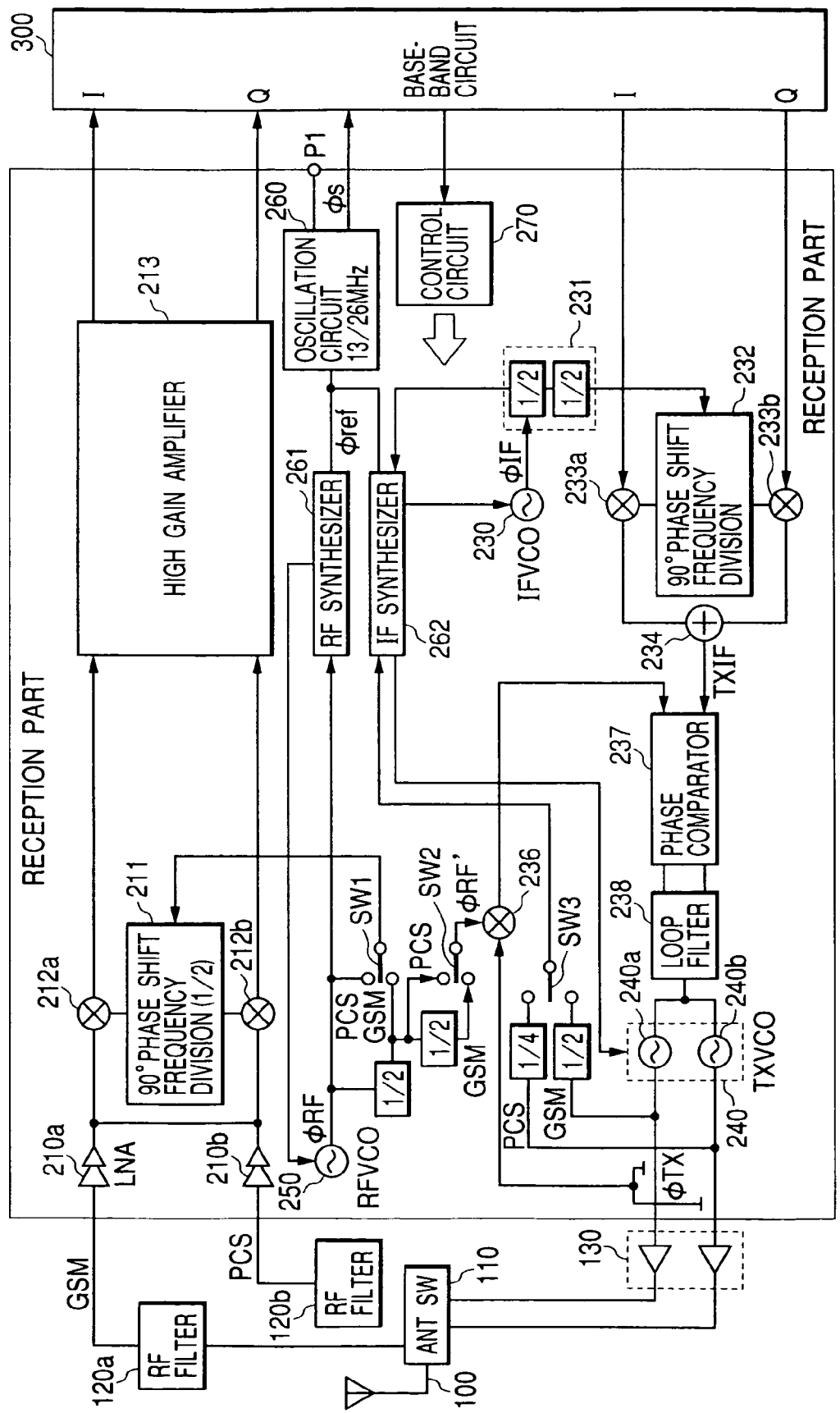
FIG. 4 is a block diagram showing an example of the configuration of a semiconductor integrated circuit device for communication (RF IC) to which an oscillation circuit according to the invention to which either a quartz oscillator or an oscillation module can be connected is applied as a reference oscillation circuit and a dual-band wireless communication system using the semiconductor integrated circuit device.

FIG. 4 is a block diagram showing an example of the configuration of a semiconductor integrated circuit device (RF IC) for communication to which an oscillation circuit according to the invention to which either a quartz oscillator or an oscillation module can be connected is applied as a reference oscillation circuit, and a dual-band wireless communication system using the semiconductor integrated circuit device for communication.

Shown in FIG. 4 are an antenna 100 for transmitting/receiving a signal waveform, a switch 110 for switching transmission/reception, RF filters 120a to 120c which are SAW filters for eliminating unnecessary waves from a reception signal, a high frequency power amplification circuit (power amplifier) 130 for amplifying a transmission signal, an RF IC 200 for demodulating a reception signal and modulating a transmission signal, and a baseband circuit (LSI) 300 for converting transmission data to I and Q signals and controlling the RF IC 200. The RF IC 200 is constructed as a semiconductor integrated circuit device on a semiconductor chip.

Reference numeral 260 denotes an oscillation circuit having the configuration as described in the foregoing embodiment. The oscillation circuit 260 is provided in the RF IC 200 and is used as a reference oscillation circuit for generating a reference frequency signal φref to an RF synthesizer 261 for generating an oscillation signal φRF required by a reception part and an IF synthesizer 262 for generating an oscillation signal φIF of an intermediate frequency required by the transmission part. Each of the synthesizers 261 and 262 is constructed by a frequency dividing circuit, a phase comparing circuit, a charge pump, a loop filter, and the like. By feeding back oscillation signals of VCOs 250 and 230, PLL loops are formed.

Since the reference frequency signal φref is requested to have high frequency precision, an external quartz oscillator or an oscillation module is connected to the reference oscillation circuit 264. As the reference frequency signal φref, a frequency such as 26 MHz or 13 MHz is selected because a quartz oscillator of such a frequency is available at relatively low price. An oscillation signal of 26 MHz or 13 MHz obtained by dividing 26 MHz generated by the oscillation circuit 260 is supplied as an operation clock signal φs to the baseband circuit 300.

Although not limited, the RF IC 200 of the embodiment is constructed so that modulation/demodulation of a signal by two communication systems of GSM 900 and PCS 1900 can be performed. Accordingly, as RF filters, the filter 120a for making pass a reception signal of the frequency band of the GSM system and the filter 120b for making pass a reception signal of the frequency band of the PCS system are provided. The RF IC 200 of the embodiment is constructed by, roughly, a reception circuit, a transmission circuit, and a control circuit constructed by other control circuits and circuits common to transmission/reception systems such as clock circuits.

The reception circuit includes: low noise amplifiers 210a and 210b for amplifying a reception signal, a phase-shift frequency-dividing circuit 211 for frequency-dividing the oscillation signal φRF generated by the RF oscillation circuit (RF VCO) 250 to thereby generate orthogonal signals of which phases are shifted from each other by 90°; demodulating circuits 212a and 212b taking the form of a mixer for performing demodulation by combining the reception signal amplified by the low noise amplifiers 210a and 210b with the orthogonal signals generated by frequency division in the phase-shift frequency-dividing circuit 212; and a high gain amplifier 213 for amplifying each of the demodulated I and Q signals and outputting the amplified signals to the baseband circuit 300.

The high gain amplifier 213 has a configuration in which a plurality of low pass filters and gain control amplifiers are alternately connected in series and an amplifier of which gain is fixed is connected in the final stage. The high gain amplifier 213 amplifies each of the I signal and the Q signal and outputs the amplified signals to the baseband circuit 300.

The transmission circuit TXC includes: the oscillation circuit (IFVCO) 230 for generating the oscillation signal φIF of the intermediate frequency such as 640 MHz; a frequency dividing circuit 231 for dividing the oscillation signal φIF generated by the oscillation circuit 230 to ¼, thereby generating a signal such as 160 MHz; a phase-shift frequency-dividing circuit 232 for dividing the signal obtained by frequency division of the frequency dividing circuit 231 and generating orthogonal signals whose phases are shifted from each other by 90°; modulating circuits 233a and 233b for modulating the generated orthogonal signals by using an I signal and a Q signal supplied from the baseband circuit 300; an adder 234 for combining the modulated signals; an oscillation circuit (TXVCO) 240 for transmission for generating a transmission signal φTX of a predetermined frequency; an offset mixer 236 for mixing a feedback signal obtained by extracting the transmission signal φTX output from the oscillation circuit (TXVCO) 240 for transmission by a coupler or the like with a signal φRF' obtained by frequency-dividing the oscillation signal φRF generated by the oscillation circuit (RFVCO) 250 for RF, thereby generating a signal of a frequency corresponding to the frequency difference of the signals; a phase comparator 237 for comparing an output of the offset mixer 236 with a signal TXIF obtained by the adder 234, thereby detecting the phase difference; and a loop filter 238 for generating a voltage according to an output of the phase comparator 237. A resistor and a capacitor constructing the loop filter 238 may be connected as external devices to an external terminal of the RF IC of the embodiment.

The oscillation circuit (TXVCO) 240 for transmission is constructed by an oscillation circuit 240a for generating a transmission signal of the GMS system of 880 MHz or the like, and an oscillation circuit 240b for generating a transmission signal of the PCS system of 1,910 MHz or the like. The reason why two oscillation circuits are provided is because it is not easy to design the oscillation circuit for transmission of which frequency variation range is wider than that of the oscillation circuit 250 for high frequency and the oscillation circuit 230 of an intermediate frequency and which can cover everything. In the embodiment, a PLL circuit for transmission (TXPLL) for performing frequency conversion is constructed by the phase comparator 237, loop filter 238, oscillation circuits 240a and 240b for transmission (TXVCO), and offset mixer 236.

On the chip of the RF IC 200 of the embodiment, the control circuit 270 for controlling the whole chip in accordance with a control signal or control data supplied from the baseband circuit 300 is provided.

In FIG. 4, blocks to which fractions such as ½, and ¼ are given are frequency dividing circuits. SW1, SW2, and SW3 denote switches whose connection state is switched between a GSM mode for performing transmission/reception in accordance with the GSM system and a PCS mode for performing transmission/reception in accordance with the PCS system and for selecting a frequency dividing ratio of a signal to be transmitted. The switches SW1 to SW3 are controlled by a signal from the control circuit 270.

In addition to the switching control of the switches SW1 to SW3, the control circuit 270 generates internal control signals according to operation modes such as a reception mode, a transmission mode, an idle mode, a warming-up mode, and the like on the basis of a signal from the baseband circuit 300 and supplies the internal control signals to the internal circuit. The baseband circuit 300 can be constructed by a microprocessor or the like.

In the dual-band wireless communication system of the embodiment, for example, in response to an instruction from the baseband circuit 300, the control circuit 270 changes the frequency φRF of the oscillation signal of the oscillation circuit 250 for RF in accordance with a channel to be used and switches the switch SW2 between the GSM mode and the PCS mode at the time of transmission/reception, thereby changing the frequency of a signal supplied to the offset mixer 236. In such a manner, the transmission frequency is switched.

In the embodiment, the oscillation frequency of the oscillation circuit (IFVCO) 230 for intermediate frequency is set to, for example, 640 MHz in the GSM or PCS system. 640 MHz is divided to ⅛ by the frequency dividing circuit 231 and the phase frequency dividing circuit 233, thereby generating a carrier wave of 80 MHz (TXIF) and performing modulation.

On the other hand, the oscillation frequency of the oscillation circuit (RFVCO) 250 for RF varies between the reception mode and the transmission mode. In the transmission mode, the oscillation frequency fRF of the oscillation circuit (RFVCO) 250 for RF is set to, for example, 3,840 MHz in the case of GSM and is set to, for example, 3,980 MHz in the case of PCS. In the case of GSM, the oscillation frequency fRF is divided into ¼ by the frequency dividing circuit. In the case of PCS, the oscillation frequency fRF is divided into ½. The resultant value is supplied as φRF' to the offset mixer 236.

In the offset mixer 236, a signal corresponding to the difference (fRF'−fTX) between φRF' and the frequency of the oscillation signal φTX for transmission from the oscillation circuit (TXVCO) 240 for transmission is output. A PLL for transmission (TXPLL) operates so that the frequency of the difference signal coincides with the frequency of the modulation signal TXIF. In other words, the TXVCO 240 is controlled so as to oscillate at a frequency corresponding to the difference between the frequency (fRF/4) of the oscillation signal φRF' from the RFVCO 250 and the frequency (fTX) of the modulation signal TXIF.

Each of the IFVCO 230, TXVCO 240, and RFVCO 250 is constructed by a differential oscillation circuit using an LC resonance circuit and has a variable capacitance diode as a variable capacitor element. The capacitance value of the variable capacitance diode is changed by the control voltage from the synthesizers 261 and 262, thereby changing the oscillation frequency.

Figure 5A:
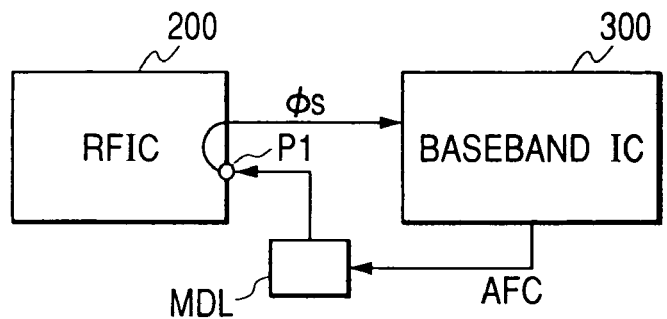
FIG. 5A is a system configuration diagram showing a case where an oscillation module is connected to an external terminal of the oscillation circuit and an oscillation signal is input from the outside in the communication system of FIG. 4.
Figure 5B:
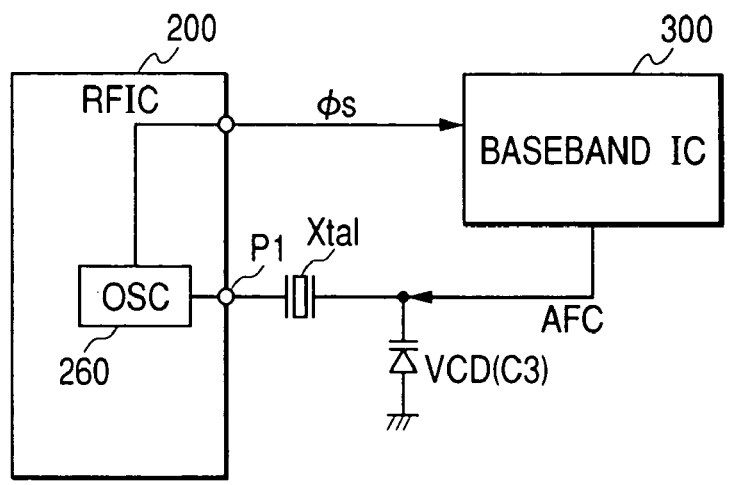
FIG. 5B is a system configuration diagram showing a case where a quartz oscillator is connected to an external terminal of the oscillation circuit and an oscillation signal is generated by an internal oscillation circuit.

FIG. 5A shows a system configuration of the case where the oscillation module MDL is connected to the external terminal P1 of the oscillation circuit 260 and an oscillation signal is input from the outside in the communication system of FIG. 4. FIG. 5B shows a system configuration of the case where the quartz oscillator XTAL is connected to the external terminal P1 of the oscillation circuit 260 and an oscillation signal is generated by the internal oscillation circuit 260.

Figure 6:
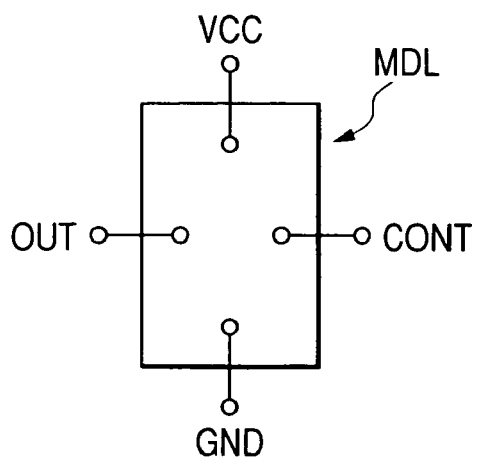
FIG. 6 is a diagram illustrating a terminal configuration of the oscillation module used in the embodiment.

A general oscillation module MDL has, as shown in FIG. 6, two power source terminals VCC and GND, an oscillation output terminal OUT, and a control terminal CONT. The oscillation frequency of the oscillation module MDL can be controlled according to the voltage Vcont applied to the control terminal CONT.

The system of FIG. 5A is constructed so that a frequency control signal AFC is supplied from the baseband circuit 300 to the control terminal CONT of the oscillation module MDL. As the frequency of the oscillation module of a portable telephone varies according to a device of the user, the baseband circuit 300 compares the frequency of a reception signal from a basestation with the frequency of a reference clock signal φs from the RF IC 200 and generates and outputs the frequency control signal AFC which makes the frequency of the reference clock signal φs coincide with the frequency of the reception signal from the basestation. The frequency control signal AFC is input to the control terminal CONT of the oscillation module MDL, thereby controlling the module.

In the system of FIG. 5B, a variable capacitance diode VCD of which capacitance value is variable is used as the external capacitor C3 in FIG. 1 connected between the quartz oscillator XTAL and the ground point. The frequency control voltage AFC is applied from the baseband circuit 300 to the cathode-side terminal of the variable capacitance diode VCD. With the configuration, a control for making the frequency of an oscillation signal (reference clock signal φs) generated from the oscillation circuit 260 of the RF IC 200 coincide with the frequency of a transmission/reception signal to/from the basestation is performed.

Although the invention achieved by the inventor herein has been described concretely on the basis of the embodiments, the invention is not limited to the embodiments. For example, although a bipolar transistor is used in the oscillation circuits of the embodiments of FIGS. 1 and 2, a MOSFET may be used in place of the bipolar transistor.

The bias circuit for making the bias current pass to the transistor Q1 is not limited to the circuit as in the embodiments constructed by the resistors R3 and R4, the transistor Q3, and the resistor R5 which are connected in series and the transistor Q2 having the base to which a voltage divided by the resistors R3 and R4 is applied. Alternately, a current source using a current mirror circuit or a current source circuit using an operation amplifier may be used.

The case of applying the invention achieved by the inventor herein to the reference oscillation circuit in the RF IC for use in the wireless communication system of a portable telephone capable of performing communication in two communication systems of GSM and PCS in the fields of use as the background of the invention has been described above. The invention is not limited to the case but can be also applied to three bands (GSM 900, DCS 1800, and PCS 1900) and can be utilized for a general oscillation circuit for use in a system requiring an oscillation signal of high precision.

Effects obtained by representative one of the inventions disclosed in the application will be briefly described as follows.

According to the invention, a semiconductor integrated circuit device having therein an oscillation circuit to which either the oscillator or the oscillation module, that can be freely selected by the user, is connected as an external part of the reference oscillation circuit can be realized without largely increasing the number of external parts or the number of external terminals and without largely increasing the circuit scale or the chip area. By using the semiconductor integrated circuit device, a portable telephone having the smaller number of parts and smaller size can be realized.

What is claimed is:

1. A semiconductor integrated circuit device comprising:
   a demodulation circuit for demodulating a reception signal;
   a first oscillation circuit for generating a signal to be combined with the reception signal or an oscillation signal as a base of the signal;

a modulation circuit for modulating a transmission signal;

a second oscillation circuit for generating a signal to be combined with the transmission signal or an oscillation signal as a base of the signal;

a reference oscillation circuit for generating a reference frequency signal which determines the frequency of each of oscillation signals generated by said first and second oscillation circuits; and first and second external terminals provided in correspondence with said reference oscillation circuit, wherein said reference oscillation circuit includes a transistor of which control terminal is connected to said first external terminal, a capacitor element connected between said first and second external terminals, and a resistive element connected between said second external terminal and a power source voltage terminal, said reference oscillation circuit can oscillate when a part of an output of said transistor is fed back to the control terminal of the transistor, and said second external terminal is set to a predetermined potential or an open state depending on either an oscillator or an electronic part for oscillation for outputting an oscillation signal is connected to said first external terminal.

2. The semiconductor integrated circuit device according to claim 1, wherein in said reference oscillation circuit, a part of an output of said transistor is fed back to the control terminal of the transistor via said capacitor element.

3. The semiconductor integrated circuit device according to claim 1, wherein said capacitor element is constructed by a first capacitor element and a second capacitor element connected in series between said first and second external terminals, an emitter terminal or a source terminal of said transistor is connected to a connection node between said first and second capacitor elements, and an emitter voltage or a source voltage of said transistor is fed back to the control terminal of the transistor via said first capacitor element.

4. The semiconductor integrated circuit device according to claim 1, further comprising a bias circuit for making current flow to said transistor.

5. The semiconductor integrated circuit device according to claim 4, wherein said bias circuit has a second transistor having a control terminal to which the voltage applied to the control terminal of said transistor is applied, a plurality of resistive elements connected in series with the second transistor, and a third transistor connected in series with said transistor, and a voltage divided by said plurality of resistive elements is applied to the control terminal of said third transistor, thereby determining the current made to flow to said transistor.

6. A wireless communication system comprising:

a semiconductor integrated circuit device according to claim 1; and a second semiconductor integrated circuit device for processing a reception signal demodulated by said semiconductor integrated circuit device, generating a baseband signal on the basis of information to be transmitted, and supplying the baseband signal to said semiconductor integrated circuit device, wherein an oscillator is connected to said first external terminal and said predetermined potential is set for said second external terminal.

7. The wireless communication system according to claim 6, wherein a variable capacitor element is further connected in series with said oscillator between said first external terminal and a predetermined potential terminal on the outside, and a frequency control voltage output from said second semiconductor integrated circuit device is applied to a connection node between said oscillator and said variable capacitor element.

8. The wireless communication system according to claim 6, wherein a signal used as an operation clock signal of an internal circuit of said second semiconductor integrated circuit device is supplied from said reference oscillation circuit to the second semiconductor integrated circuit device.

9. A wireless communication system comprising:

a semiconductor integrated circuit device according to claim 1; and a second semiconductor integrated circuit device for processing a reception signal demodulated by said semiconductor integrated circuit device, generating a baseband signal on the basis of information to be transmitted, and supplying the baseband signal to said semiconductor integrated circuit device, wherein an electronic part for oscillation is connected to said first external terminal, and the potential of said second external terminal is set in a floating state.

10. The wireless communication system according to claim 9, wherein said electronic part for oscillation has a control terminal, an oscillation frequency is made changeable in accordance with a signal input to the control terminal, and a frequency control signal output from said second semiconductor integrated circuit device is input to the control terminal of said electronic part for oscillation.

11. The wireless communication system according to claim 9, wherein a signal used as an operation clock signal of an internal circuit of said second semiconductor integrated circuit device is supplied from said reference oscillation circuit to the second semiconductor integrated circuit device.

* * * * *